United States Patent
Watanabe

(10) Patent No.: US 6,872,012 B2
(45) Date of Patent: Mar. 29, 2005

(54) OPTICAL ISOLATOR MODULE

(75) Inventor: Akio Watanabe, Tokyo (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 17 days.

(21) Appl. No.: 10/399,403

(22) PCT Filed: Aug. 21, 2002

(86) PCT No.: PCT/JP02/08425
§ 371 (c)(1),
(2), (4) Date: Apr. 22, 2003

(87) PCT Pub. No.: WO03/019263
PCT Pub. Date: Mar. 6, 2003

(65) Prior Publication Data
US 2004/0028354 A1 Feb. 12, 2004

(30) Foreign Application Priority Data
Aug. 23, 2001 (JP) .................................. 2001-252871

(51) Int. Cl.[7] .................................................. G02B 6/36
(52) U.S. Cl. ............................ 385/94; 385/88; 385/92; 385/93
(58) Field of Search ....................................... 385/88–94

(56) References Cited

U.S. PATENT DOCUMENTS 4,548,466 A * 10/1985 Evans et al. .................... 385/90
5,978,535 A    11/1999 Mitsuda et al.
6,318,910 B1 * 11/2001 Higashikawa ................. 385/94

FOREIGN PATENT DOCUMENTS

| JP | 6-194548 | 7/1994 |
|---|---|---|
| JP | 8-227028 | 9/1996 |
| JP | 10-256672 | 9/1998 |
| JP | 11-295564 | 10/1999 |
| JP | 2998735 | 11/1999 |
| JP | 2000-147312 | 5/2000 |
| JP | 2001-215372 | 8/2001 |
| JP | 2002-116355 | 4/2002 |

* cited by examiner

Primary Examiner—Juliana K. Kang
(74) Attorney, Agent, or Firm—Armstrong, Kratz, Quintos, Hanson & Brooks, LLP

(57) ABSTRACT

An optical isolator module having a capillary 3 to which an optical fiber 2 has been fitted, an optical isolator 7 provided on the light-incident side of the capillary and a transparent member 8, and being set in a housing of a semiconductor module. The optical isolator module is provided on the side opposite to the light-incident side of the capillary, with a hermetic bead 11 which i) holds an optical fiber 2 which extends from the capillary in the direction opposite to its light-incident side and whose bare fiber stands uncovered by removing a resin coat, and ii) is fitted in a hermetically sealable state into an opening made in a housing side wall of the semiconductor module.

7 Claims, 5 Drawing Sheets

OPTICAL ISOLATOR MODULE

TECHNICAL FIELD

This invention relates to an optical isolator module which is set in a housing of a semiconductor module having a semiconductor element such as a semiconductor laser element or a semiconductor amplifier and a focusing lens and constitutes an optoelectronic unit used in optical communication and optical information systems. More particularly, this invention relates to an optical isolator module which has a structure making it easy to hermetically seal the semiconductor module and makes it possible that optical component parts made up using an organic material such as an adhesive are made airtight in the housing and also that the semiconductor element and the optical isolator are simply and easily temperature-controlled.

BACKGROUND ART

In the above optoelectronic unit used in optical communication and optical information systems, an optical isolator is required which has the function that any reflected light produced in a transmission system does not return to the semiconductor element side when the light emitted from the semiconductor element such as a semiconductor laser element is made to enter a transmission system constituted of an optical fiber, i.e., the function to prevent the semiconductor element from operating unstably because of reflection return light.

The semiconductor element is also required to be perfectly isolated from the air outside in order to prevent its function from lowering because of the atmosphere or the atmospheric humidity.

Moreover, the semiconductor element may change in characteristics with its temperature variations. Hence, its temperature is commonly controlled by a Peltier device. However, since the optical isolator also has temperature characteristics, the temperature is controlled by the Peltier device also in respect of the optical isolator in the case of a semiconductor module constituting a high-performance optoelectronic unit.

Meanwhile, the cost of assembling of such a semiconductor module constituting an optoelectronic unit can be made lower as the component parts for assembly are in a smaller number. However, any conventional optical isolator is set independent from optical-fiber component parts, and hence, in order to put these into an assembly, it has been necessary to provide an assembly equipment for exclusive use.

Accordingly, in order to achieve low cost for semiconductor modules, as shown in FIG. 5, an optical isolator module g has been proposed in which an optical isolator c and an optical fiber a are set integral (Japanese Patent Application Laid-open No. 6-194548). In using such an optical isolator module g, however, because of the structure of this optical isolator module g, the temperature of the whole housing i of a semiconductor module h fitted with the optical isolator module g must be controlled, and hence it has been difficult to control the temperature of the optical isolator c. Incidentally, in FIG. 5, letter symbol b denotes a capillary to which the optical fiber a has been fitted; d, a transparent member; e, a semiconductor laser element; and f, a focusing lens n.

In a semiconductor module required to have an especially high reliability, it has also been necessary in some cases to provide a structure in which any component parts making use of a resin are completely isolated from the semiconductor element so that its function can be prevented from lowering because of any gases released from an adhesive used for bonding optical component parts.

Accordingly, in the conventional optical isolator modules, it has often been observed to employ a method in which the optical component parts are assembled by fastening them with solder without use of any adhesive.

Then, where the semiconductor element set in the semiconductor module is a semiconductor laser element, its emergent light is linear polarization, and hence an isolator of a polarization-dependent type can be used. In this case, a method can be employed in which a metallic film is added to the side of each of a glass polarizer and a Faraday rotator and this is fastened to a substrate material with solder. There, however, has been a problem that an attempt to replace the glass polarizer, which is expensive, with a relatively inexpensive birefringent crystal, e.g., a crystal material such as rutile, lithium niobate or $YVO_4$ for the purpose of cost reduction makes it very difficult to fasten the metallic film with solder because these materials have a great anisotropy in the coefficient of thermal expansion and also the materials themselves are brittle.

Meanwhile, where the semiconductor element set in the semiconductor module is a polarization-independent typea semiconductor amplifier, it is essential to use a polarization-independent type optical isolator making use of a birefringent crystal. In fact, however, any solder-fastenable polarization-independent type optical isolator has not been put into practical use.

The present invention was made taking note of such problems. Accordingly, objects of the present invention are i) to provide an optical isolator module which has a structure making it easy to hermetically seal the semiconductor module and makes it possible that optical component parts made up using an organic material such as an adhesive are made airtight in the housing and also that the semiconductor element and the optical isolator is simply and easily temperature-controlled, and particularly ii) to materialize a structure applicable in the polarization-independent type optical isolator making use of a birefringent crystal, which is essential when the semiconductor module is the polarization-independent type semiconductor amplifier module, to enable manufacture of an inexpensive semiconductor amplifier module.

DISCLOSURE OF THE INVENTION

More specifically, the present invention is an optical isolator module comprising a capillary to which an optical fiber whose end (end face) inclines has been fitted, an optical isolator provided on the light-incident side of the capillary and a transparent member provided on the light-incident side of the optical isolator; the optical isolator module being;

set in a housing of a semiconductor module having a semiconductor element and a focusing lens; the light emitted from the semiconductor element and collected by the focusing lens being transmitted through the transparent member and optical isolator and made incident on the optical fiber end; and provided on the side opposite to the light-incident side of the capillary, with a hermetic bead which i) holds an optical fiber which extends from the capillary in the direction opposite to its light-incident side and whose bare fiber (core/cladding bare fiber) stands uncovered by removing a resin coat, and ii) is fitted in a hermetically sealable state into an opening made in a housing side wall of the semiconductor module.

The optical isolator module according to the present invention makes it possible to hermetically seal the semiconductor module because the hermetic bead provided on the side opposite to the light-incident side of the capillary is fitted in a hermetically sealable state into the opening made in a housing side wall of the semiconductor module.

This optical isolator module also has a structure in which the optical isolator is set in the housing of the semiconductor module having a semiconductor element in its interior. Hence, it can be placed on a supporting mount having a plane common to both the component parts of the optical isolator and the semiconductor element. This enables temperature control of the optical isolator and semiconductor element without temperature control of the whole housing.

In addition, in this optical isolator module, the isolator part consisting of the capillary, the optical isolator and the transparent member and the hermetic bead part are connected through only the optical fiber, and hence it follows that these two component parts (the isolator part and the hermetic bead part) are flexibly joined.

Accordingly, where a method in which the hermetic bead part and the isolator part are individually fastened is employed as a method of mounting the optical isolator module to the semiconductor module, the optical isolator module having the above structure has a tolerance for any very slight mutual positional deviation due to thermal expansion or the like of members. Hence, this enables stable operation of the semiconductor module over a long period of time.

Herein, in respect of the hermetic bead and capillary of the optical isolator module according to the present invention, these may be made up using any desired materials on condition that the above effect can be brought out. Preferably, these may be made up using metallic materials each having been worked to have a small through-hole through which the optical fiber is to be passed.

Then, in conjunction with the use of this hermetic bead made up of the metallic material having been worked to have a small through-hole, the bare fiber of the optical fiber extending from the capillary in the direction opposite to the light-incident side is coated with a metal, and also the hermetic bead and the bare fiber of optical fiber are joined with solder to each other. This enables the hermetic bead to be joined by soldering or seam welding with an inorganic material to the part of the semiconductor module through which part the optical fiber is inserted (i.e., the opening made in the housing side wall of the semiconductor module). Hence, the semiconductor element held in the semiconductor module can perfectly be isolated from the air outside.

Similarly, in conjunction with the use of the capillary made up of the metallic material having been worked to have a small through-hole, the bare fiber of the optical fiber extending from the capillary in the direction opposite to the light-incident side is coated with a metal, and also the capillary and the bare fiber of optical fiber are joined with solder to each other. This makes any deterioration with time less occur compared with a case in which they are fastened with an organic material, and enables the optical fiber to be surely fastened in a small joint length.

In the optical isolator module according to the present invention, it may also employ a structure in which the capillary, a window frame member disposed on the light-incident side of the capillary and fitted with the transparent member, and i) a cylindrical holder provided between the window frame member and the capillary and in the interior of which the optical isolator is held or ii) the cylindrical holder and a cylindrical magnet communicating therewith form a hermetically sealed space, and optical component parts of the optical isolator are held in this hermetically sealed space.

Employment of such a structure enables the optical component parts to be hermetically sealed, and hence any organic material can be utilized also on what should not be exposed to gases released from organic materials such as adhesives. This enables materialization of an inexpensive optical isolator module.

As to the transparent member of the optical isolator module according to the present invention, it may be comprised of a cross-sectionally wedge-shaped transparent material having a light-incident plane inclined in the direction opposite to the direction of inclination of the optical fiber end. Also, as to the optical isolator and the transparent member, they may obliquely be so disposed that each light-incident/emergent plane of the optical isolator and the light-incident/emergent plane of the transparent member on its optical isolator side incline in the same direction as the direction of inclination of the optical fiber end in respect to the optical axis of the optical fiber.

Thus, since the transparent member is comprised of the cross-sectionally wedge-shaped transparent material having a light-incident plane inclined in the direction opposite to the direction of inclination of the optical fiber end, the coupling efficiency of light from the semiconductor element in respect to the optical fiber can be prevented from lowering. Also, since the optical isolator and the transparent member are obliquely so disposed that each light-incident/emergent plane of the optical isolator and the light-incident/emergent plane of the transparent member on its optical isolator side incline in the same direction as the direction of inclination of the optical fiber end in respect to the optical axis of the optical fiber, the reflected light having reflected from the transparent member standing opposite to the semiconductor element whose direction of the optical axis extending until its light enters the transparent member is set parallel or substantially parallel to the direction of the optical axis of the optical fiber can be prevented from again coupling, without setting large the angle of inclination of the transparent member.

As to the transparent member and the optical isolator, they may employ a structure in which a polarizer constituting a part of optical component parts of the optical isolator is bonded to the transparent member through an optical adhesive.

BEST MODES FOR PRACTICING THE INVENTION

The present invention is described below in greater detail with reference to the accompanying drawings.

Figure 1B:
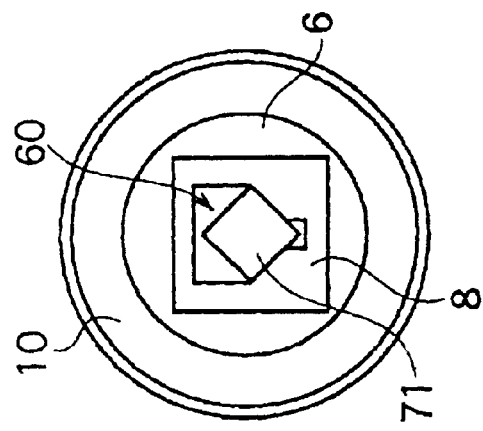
FIG. 1(B) is a front view of the optical isolator module as viewed from the light-incident side.
Figure 1A:
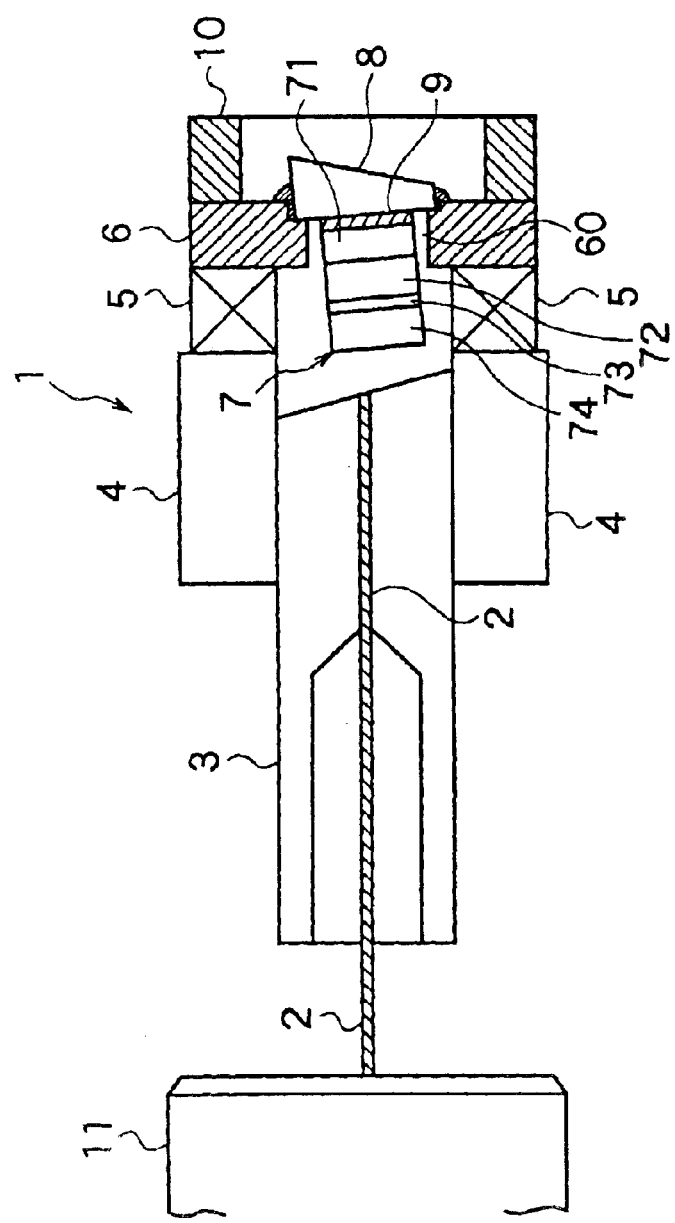
FIG. 1(A) is a schematic illustration of the construction of the optical isolator module according to the present invention.
Figure 2:
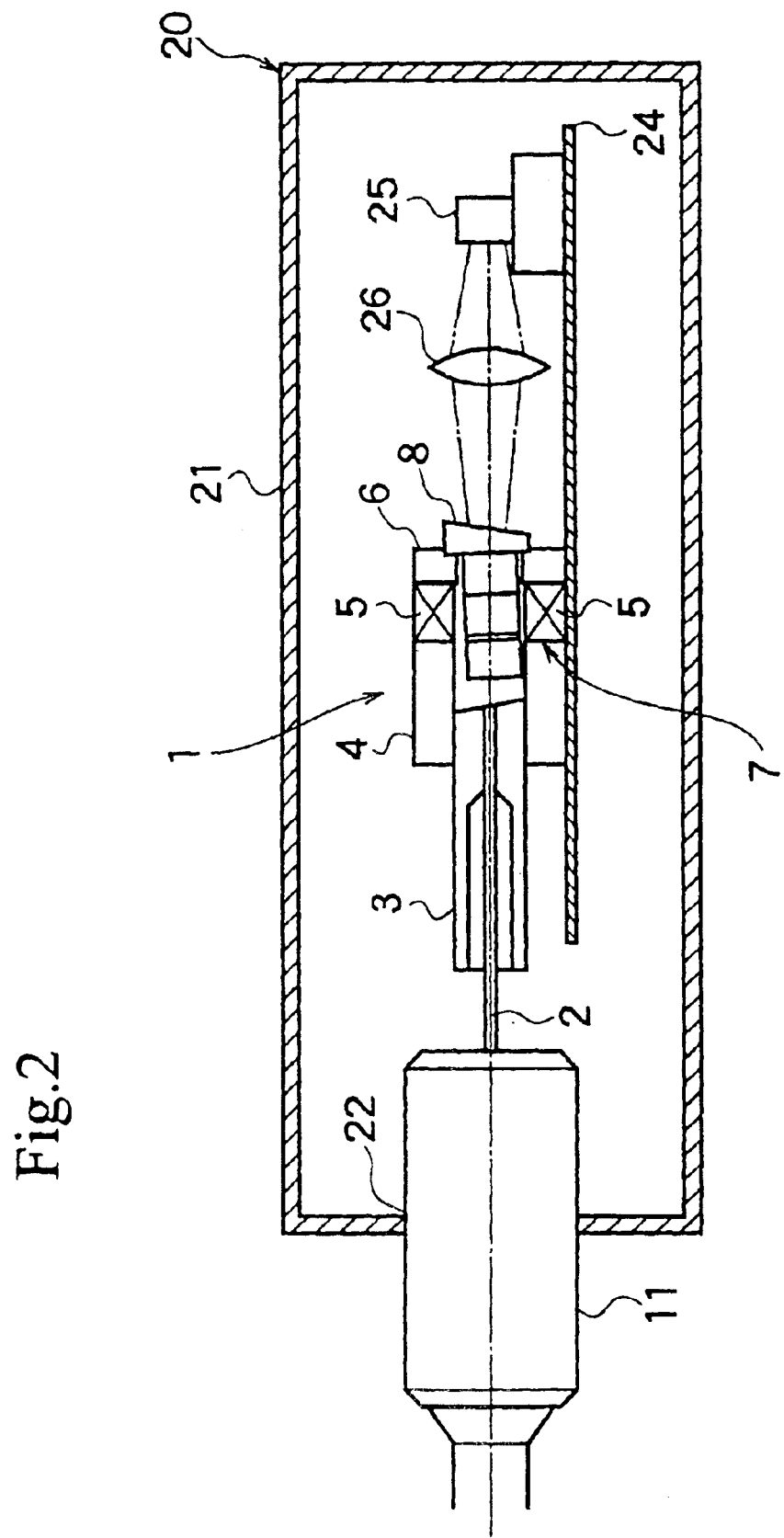
FIG. 2 is an illustration to show how the optical isolator module according to the present invention is set in the housing of the semiconductor module having a semiconductor element and a focusing lens.

As shown in FIG. 1, the present optical isolator module, denoted by reference numeral 1, is chiefly constituted of a capillary 3 made of a metal, which inclines at 13 degrees at its end and holds an end portion of an optical fiber 2 having an end having the same inclination of 13 degrees, a cylindrical holder 4 made of stainless steel (SUS304), to which the capillary 3 is fitted at its end portion side; a cylindrical magnet 5 of an Sm—Co alloy, which is fitted to the cylindrical holder 4 on its light-incident side end and has a cylinder bore communicating with a cylinder bore of the cylindrical holder 4 to form also a part of the optical isolator 7; a window frame member 6 made of stainless steel (SUS430 or SUS440), which is fitted to the cylindrical magnet 5 on its light-incident side end and has a window 60 leading to the cylindrical bore of the cylindrical magnet 5; a transparent member 8 cross-sectionally wedge-shaped and made of optical glass (BK7), which is fitted to the window frame member 6 on its light-incident side in such a way that it closes the window 60 of the window frame member 6, and is obliquely so disposed that it has a light-incident plane which inclines at 13 degrees in the direction opposite to the direction of inclination of the optical fiber 2 end and its back (i.e., the light-incident/emergent plane on the optical isolator side) inclines at 3 degrees in the same direction as the direction of inclination of the optical fiber 2 end in respect to the optical axis of the optical fiber 2; a birefringent crystal plate (polarizer) 71 bonded to the back side of the transparent member through an optical adhesive (epoxy type adhesive) to form a part of the optical isolator 7, as well as an RIG Faraday rotator 72, a half-wave plate 73 and a similar birefringent crystal plate (polarizer) 74; a guard ring 10 for protecting the transparent member 8, which is fitted to the window frame member 6 on its light-incident side wall surface and formed of a cylindrical member made of stainless steel (SUS304); and a hermetic bead 11 made of stainless steel (SUS304), which is provided on the side opposite to the light-incident side of the capillary 3 and holds an optical fiber 2 which i) extends from the capillary in the direction opposite to its light-incident side and whose bare fiber stands uncovered by removing a resin coat and ii) is fitted in a hermetically sealable state into an opening 22 made in a housing 21 side wall of a semiconductor module 20 as shown in FIG. 2. And the birefringent crystal plate (polarizer) 71, the RIG Faraday rotator 72, the half-wave plate 73 and the birefringent crystal plate (polarizer) 74 are so disposed that their light-incident/emergent planes each incline at 3 degrees in the same direction as the direction of inclination of the optical fiber 2 end in respect to the optical axis of the optical fiber 2. Incidentally, RIG is an abbreviation for a magnetic garnet (rare-earth iron garnet).

This optical isolator module 1 is manufactured according to the following procedure of assemblage.

Figure 3:
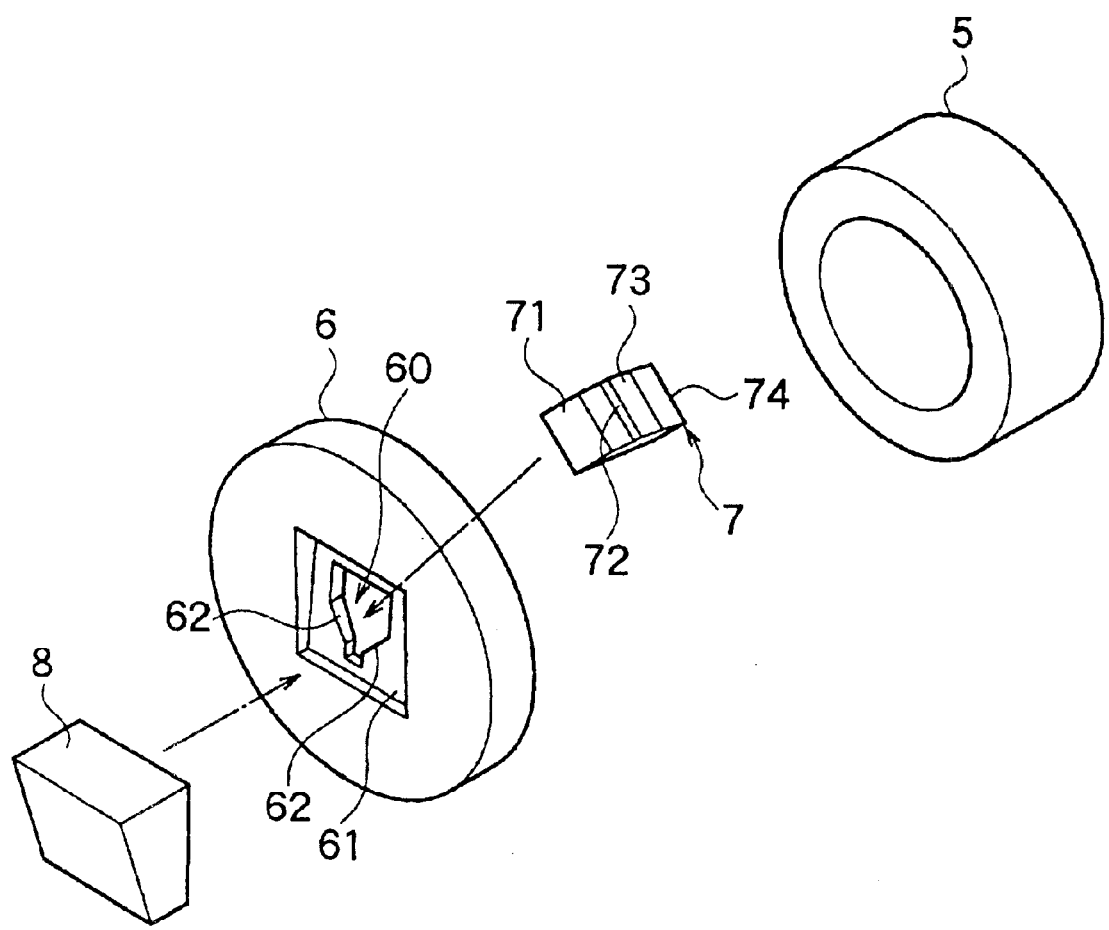
FIG. 3 is an assemblage exploded perspective view of optical isolator component parts to be set in the optical isolator module according to the present invention.

First, as shown in FIG. 3 the transparent member 8, having beforehand been metallized, is fitted into a rectangular fitting recess (this recess has a depth which is larger on the upper side than on the lower side as shown in FIG. 3) provided around the window 60 of the window frame member 6, and also this transparent member 8 is fastened to the window frame member 6 with Au—Sn solder. Here, the transparent member 8 is fitted into the above fitting recess so that the transparent member 8 may obliquely be disposed.

Next, as shown in FIG. 3 the cylindrical magnet 5 is put onto the window frame member 6 from the side opposite to the side on which the transparent member 8 has been fitted, and then fastened thereto with solder.

Next, a cross-sectionally rectangular layered structure consisting of the birefringent crystal plate (polarizer) 71, the RIG Faraday rotator 72, the half-wave plate 73 and the birefringent crystal plate (polarizer) 74, having been made integral through an optical adhesive (epoxy type adhesive), is put onto the window frame member 6 from its side on which the cylindrical magnet 5 has been fitted, in such a way that the lower edge on its end side is fitted into an opening edge 62 of the window 60 in the window frame member 6. And the layered structure is fastened, on its birefringent crystal plate (polarizer) 71 side, to the transparent member 8 by bonding using the epoxy type adhesive, which is transparent. Thereafter the cylindrical holder 4 is so placed that its cylinder bore may positionally fit the cylinder bore of the cylindrical magnet 5, and then these are fastened with solder.

Here, the reason why the window frame member 6 and the cylindrical magnet 5, as well as the cylindrical magnet 5 and the cylindrical holder 4, are fastened with solder over their whole circumferences is that these members and the capillary 3 fitted on its end side to the cylindrical holder 4 form a hermetically sealed space so that the optical component parts of the optical isolator can be held in this hermetically sealed space to seal the optical component parts hermetically.

Next, the optical fiber 2, whose bare fiber made uncovered by removing a resin coat on its end side has been coated with gold, is passed through the small through-holes (not shown) of the capillary 3 and hermetic bead 11, and a bare-fiber uncovered portion of the optical fiber is formed between the capillary 3 and the hermetic bead 11 as shown in FIG. 1(A). Thereafter, the bare fiber is fastened to the capillary 3 and the hermetic bead 11 with solder.

Finally, the capillary 3 fitted with the optical fiber 2 is fitted on its end side into the cylindrical holder 4 after its alignment by rotation, and their joint is welded by means of a laser over the whole circumference. Thus, the optical isolator module according to the present invention is obtained. Here, the reason why their joint is welded over the whole circumference is that as stated above the window frame member 6, the cylindrical magnet 5, the cylindrical holder 4 and the capillary 3 form a hermetically sealed space so that the optical component parts of the optical isolator can be held in this hermetically sealed space to seal the optical component parts hermetically.

With regard to the alignment by rotation that is performed around the optical axis of the optical fiber 2, it is an essential item for adjustment because the optical fiber 2 end is inclined in the present invention.

The optical isolator module 1 according to the present invention, thus manufactured, is, as shown in FIG. 2, set in the housing 21 of the semiconductor module 20, having a semiconductor element 25 (such as a semiconductor laser element) and a focusing lens 26, to make up an optoelectronic unit.

In this case, in the housing 21 of the semiconductor module 20, the cylindrical magnet 5 of the optical isolator 7 and the semiconductor element 25 such as a semiconductor laser element can be placed on a supporting mount 24 having a plane common to them. This enables temperature control of the optical isolator 7 and semiconductor element 25 by means of a Peltier device without temperature control of the whole housing 21.

Figures 4A, 4B:
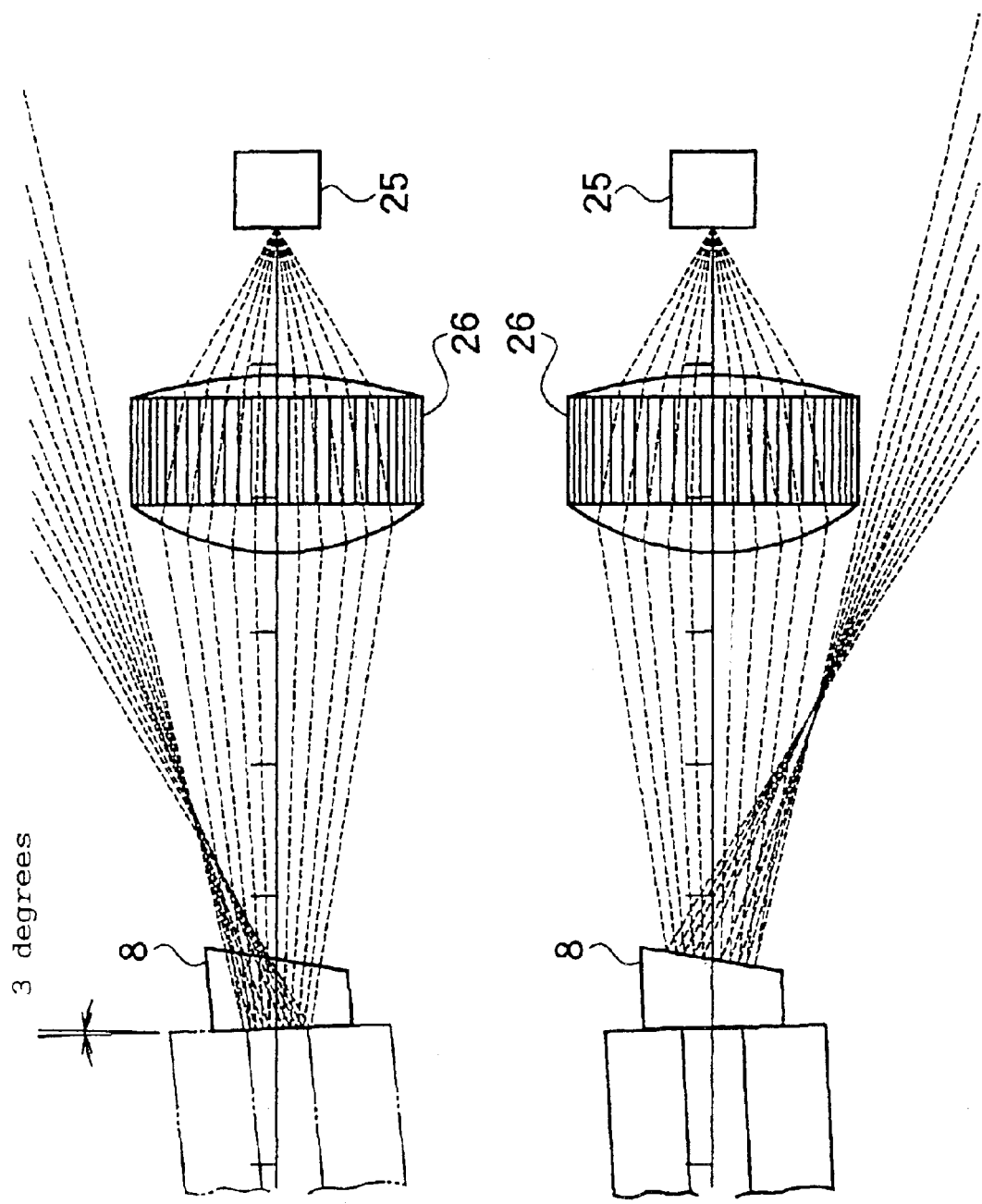
FIGS. 4(A) and 4(B) are ray-tracing plots showing the action of the cross-sectionally wedge-shaped transparent member in the optical isolator module according to the present invention.
Figure 5:
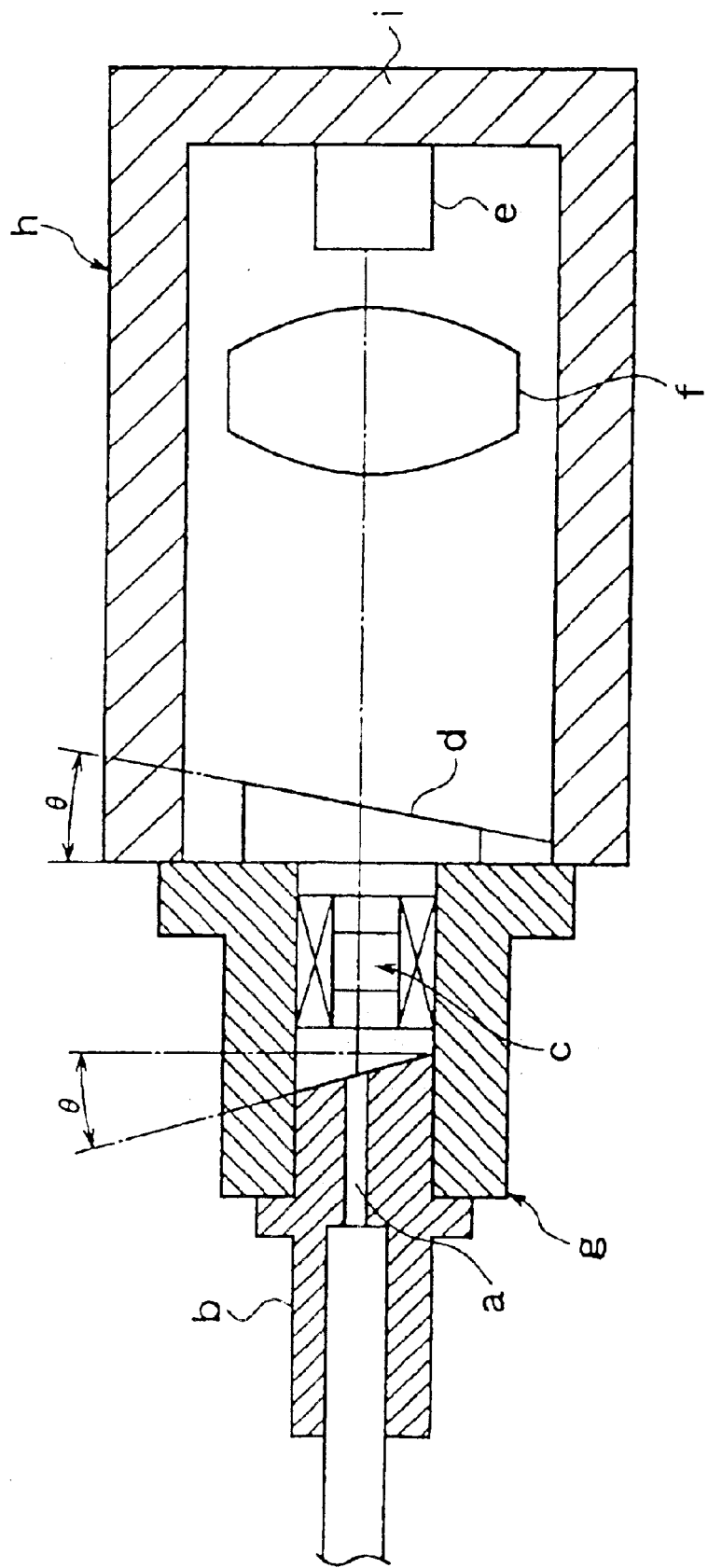
FIG. 5 is an illustration of an optoelectronic unit in which an optical isolator module according to a conventional case has been set.

In this optical isolator module 1, the optical isolator 7 and the transparent member 8 are also obliquely so disposed that each light-incident/emergent plane of the optical isolator 7 and the light-incident/emergent plane of the transparent member on its optical isolator side incline at 3 degrees in the same direction as the direction of inclination of the optical fiber 2 end in respect to the optical axis of the optical fiber 2. Hence, as shown by a ray-tracing plot in FIG. 4(A), the reflected light of the light emitted from the semiconductor element 25, having reflected on the back side of the transparent member 8, by no means returns to the focusing lens 26 and the semiconductor element 25. And the reflected light having reflected from each plane constituting the optical isolator 7, having a plane parallel to the back of the transparent member 8, also by no means returns to the focusing lens 26 and the semiconductor element 25. Also, as shown by a ray-tracing plot in FIG. 4(B), the reflected light having reflected from the surface side of the transparent member 8 (i.e., the surface of the transparent member on the semiconductor element side) by no means returns to the focusing lens 26 and the semiconductor element 25.

Thus, the reflected light against the semiconductor element 25 can surely be prevented from again coupling.

In addition, in this optical isolator module 1, the cross-sectionally wedge-shaped transparent member 8 is employed which has a light-incident plane inclined at 13 degrees in the direction opposite to the direction of inclination of the optical fiber 2 end. Hence, although the optical fiber 2 end forms an inclined plane, the coupling efficiency of light from the semiconductor element 25 in respect to the optical fiber may by no means lower.

POSSIBILITY OF INDUSTRIAL APPLICATION

As described above, in the optical isolator module according to the present invention, the hermetic bead provided on the side opposite to the light-incident side of the capillary is fitted in a hermetically sealable state into the opening made in a housing side wall of the semiconductor module. Hence, it is suited for use as an optical isolator module which makes it easy to hermetically seal the semiconductor module.

The optical isolator module according to the present invention also has a structure in which the optical isolator is set in the housing of the semiconductor module having a semiconductor element in its interior, and can be placed on the supporting mount having a plane common to both the component parts of the optical isolator and the semiconductor element. Hence, it is suited for use as an optical isolator module which enables temperature control of the optical isolator and semiconductor element without temperature control of the whole housing.

In addition, the capillary, the window frame member fitted with the transparent member, and i) the cylindrical holder or ii) the cylindrical holder and the cylindrical magnet communicating therewith form a hermetically sealed space, and optical component parts of the optical isolator are held in this hermetically sealed space. This enables the optical component parts to be hermetically sealed. Hence, this optical isolator module is suited for use as an inexpensive optical isolator module in which optical component parts made up using an adhesive or the like can be mounted.

What is claimed is:

1. An optical isolator module comprising a capillary to which an optical fiber whose end inclines has been fitted, an optical isolator provided on the light-incident side of the capillary and a transparent member provided on the light-incident side of the optical isolator; the optical isolator module being;
   set in a housing of a semiconductor module having a semiconductor element and a focusing lens; the light emitted from the semiconductor element and collected by the focusing lens being transmitted through the transparent member and optical isolator and made incident on the optical fiber end; and
   provided on the side opposite to the light-incident side of the capillary, with a hermetic bead which i) holds the optical fiber which extends from the capillary in the direction opposite to its light-incident side and whose bare fiber stands uncovered by removing a resin coat, and ii) is fitted in a hermetically sealable state into an opening made in a side wall of the housing of the semiconductor modules,
   wherein the bare fiber of the optical fiber extending from the capillary in the direction opposite to the light-incident side is coated with a metal, and the hermetic bead and the bare fiber of optical fiber are joined with solder to each other, with the hermetic bead and the capillary being spaced apart from each other, and
   wherein the capillary, a window frame member disposed on the light-incident side of the capillary and fitted with the transparent member, a cylindrical holder to which the capillary is fitted, and a cylindrical magnet provided between the cylindrical holder and the window frame member, form a hermetically sealed space, and optical component parts of the optical isolator are held in this hermetically sealed space.

2. The optical isolator module according to claim 1, wherein the hermetic bead is made up of a metallic material having been worked to have a small through-hole through which the optical fiber is to be passed.

3. The optical isolator module according to claim 1, wherein the capillary and the bare fiber of optical fiber are joined with solder to each other.

4. The optical isolator module according to claim 3, wherein the capillary is made up of a metallic material having been worked to have a small through-hole through which the optical fiber is to be passed.

5. The optical isolator module according to claim 1, wherein the transparent member is comprised of a cross-sectionally wedge-shaped transparent material having a light-incident plane inclined in the direction opposite to the direction of inclination of the optical fiber end.

6. The optical isolator module according to claim 1, wherein the optical isolator and the transparent member are obliquely so disposed that each light-incident/emergent plane of the optical isolator and the light-incident/emergent plane of the transparent member on its optical isolator side incline in the same direction as the direction of inclination of the optical fiber end in respect to the optical axis of the optical fiber.

7. The optical isolator module according to claim 1, wherein a polarizer constituting a part of optical component parts of the optical isolator is bonded to the transparent member through an optical adhesive.

* * * * *